(12) United States Patent
Pfeifle

(10) Patent No.: US 9,575,993 B2
(45) Date of Patent: Feb. 21, 2017

(54) BINARY DIFFERENCE OPERATIONS FOR NAVIGATIONAL BIT STREAMS

(71) Applicant: HERE Global B.V., Veldhoven (NL)

(72) Inventor: Martin Pfeifle, Seewald (DE)

(73) Assignee: HERE Global B.V., Eindhoven (NL)

( * ) Notice: Subject to any disclaimer, the term of this patent is extended or adjusted under 35 U.S.C. 154(b) by 13 days.

(21) Appl. No.: 14/586,272

(22) Filed: Dec. 30, 2014

(65) Prior Publication Data

US 2016/0188630 A1    Jun. 30, 2016

(51) Int. Cl.
| | |
|---|---|
| G06F 17/30 | (2006.01) |
| G06F 9/445 | (2006.01) |
| H03M 7/30 | (2006.01) |
| G01C 21/00 | (2006.01) |

(52) U.S. Cl.
CPC ......... *G06F 17/30241* (2013.01); *G01C 21/00* (2013.01); *G06F 8/65* (2013.01); *G06F 17/30076* (2013.01); *G06F 17/30174* (2013.01); *G06F 17/30876* (2013.01); *H03M 7/30* (2013.01); *H03M 7/3093* (2013.01)

(58) Field of Classification Search
CPC .................. G06F 17/30241; G06F 8/65; G06F 17/30076; G06F 17/30174; G06F 17/30876; H03M 7/30; H03M 7/3093; G01C 21/00
USPC ....................................................... 717/169
See application file for complete search history.

(56) References Cited

U.S. PATENT DOCUMENTS

| | | | |
|---|---|---|---|
| 5,502,640 A | 3/1996 | Yagyu et al. | |
| 5,845,228 A | 12/1998 | Uekawa et al. | |
| 6,260,042 B1 | 7/2001 | Curbera et al. | |
| 6,473,770 B1 | 10/2002 | Livshutz et al. | |
| 6,615,219 B1 | 9/2003 | Bruso et al. | |
| 6,741,929 B1 | 5/2004 | Oh et al. | |
| 7,957,894 B2 | 6/2011 | Wellmann | |
| 8,330,996 B2 * | 12/2012 | Sato .................. | H04N 1/00846 283/113 |
| 8,572,033 B2 | 10/2013 | Shukla | |
| 2002/0162064 A1* | 10/2002 | Shimizu ................. | G11C 29/12 714/726 |
| 2004/0135705 A1 | 7/2004 | Umezu et al. | |
| 2006/0282457 A1 | 12/2006 | Williams | |
| 2007/0129885 A1 | 6/2007 | Wellmann | |
| 2008/0109443 A1 | 5/2008 | Tokui et al. | |
| 2008/0201070 A1 | 8/2008 | Kikuchi | |

(Continued)

FOREIGN PATENT DOCUMENTS

| | | |
|---|---|---|
| EP | 2339481 | 6/2011 |
| GB | 2351167 | 12/2000 |

OTHER PUBLICATIONS

Chawathe et al., Change Detection in Hierarchically Structured Information, Accessed Aug. 17, 2013, Department of Computer Science, Stanford University.

(Continued)

*Primary Examiner* — Viva Miller
(74) *Attorney, Agent, or Firm* — Lempia Summerfield Katz LLC

(57) ABSTRACT

A computing device may identify a series of bits representative of a first binary large object (BLOB) for navigation data including road segments and road attributes. The computing device duplicates each bit of the series of bits a predetermined number of times to form a first bit string. The first bit string is larger than the series of bits by a factor of the predetermined number. The computing device performs a binary difference of the first bit string to a second bit string representative of a second BLOB. A result of the binary difference is stored in a navigation patch file.

16 Claims, 10 Drawing Sheets

(56) References Cited

U.S. PATENT DOCUMENTS

| | | | |
|---|---|---|---|
| 2009/0030606 A1 | 1/2009 | Pfeifle et al. | |
| 2009/0276771 A1 | 11/2009 | Nickolov et al. | |
| 2012/0011178 A1 | 1/2012 | Pfeifle et al. | |
| 2012/0036150 A1 | 2/2012 | Richter et al. | |
| 2013/0159974 A1 | 6/2013 | Norton et al. | |
| 2014/0032813 A1* | 1/2014 | Liu | G11C 16/10 711/103 |
| 2014/0108462 A1* | 4/2014 | Pfeifle | G06F 17/30318 707/795 |
| 2014/0237464 A1* | 8/2014 | Waterman | G06F 8/65 717/172 |

OTHER PUBLICATIONS

International Search Report and Written Opinion cited in PCT/EP2013/070792, mailed Jan. 8, 2014.

U.S. Appl. No. 13/302,000, filed Nov. 22, 2011.

Wellmann, Route Search with Tile-Generated Rank, Power Point presentation, Feb. 1, 2006, 53 pages, Harman/Becker.

"Patch (Unix)", Wikipedia, Dec. 11, 2014, XP002757144, Retrieved from the Internet: URL: https://en.wikipedia.org/w/index.php?title=Patch_%28Unix%29&oldid=637559972 [retrieved on Apr. 29, 2016].

European Search Report for related European Application No. 15202697.7 dated May 11, 2016.

Gabriel Schwab: "Navigation Data Standard (NDS)", Internet article, Sep. 23, 2014, XP002757145, Retrieved from the Internet: URL: http://www.nds-association.org/wp-content/uploads/2014-09-23_NDS_on_EB_Automotive_Day_V1.3.pdf [retrieved on Apr. 29, 2016].

* cited by examiner

BINARY DIFFERENCE OPERATIONS FOR NAVIGATIONAL BIT STREAMS

FIELD

The following disclosure relates to map updates, and more particularly to map updates of a geographic database based on binary difference operations.

BACKGROUND

Map databases are used in computer-based systems that provide useful features to users. For example, the identification of routes to destinations or points of interests. A navigation system determines the optimum route to be taken by the end user to travel from the origin to the destination location from map data stored in a geographic (or map) database. Map databases are also used in advanced driver assistance systems, such as curve warning systems, adaptive cruise control systems and headlight aiming systems. Map databases are also used in systems that improve vehicle fuel economy, such as systems that optimize transmission gear selection taking into account upcoming slope and speed changes.

As new roads are built, other roads are closed, or locations of business are changed, the geographic database is updated. One way to update map data is to replace the entire existing map database with a new version of the geographic database containing new, updated map data. However, a replacement of the entire map database is a relatively expensive and time consuming process and may be unnecessary considering that much of the map data may not be changed from the old version to the new version. Further, wholesale map updates in mobile devices introduce challenges because bandwidth is often limited and map updates are often bulky and require high bandwidth.

SUMMARY

In one embodiment, a computing device identifies a series of bits representative of a first binary large object (BLOB) for navigation data including road segments and road attributes. Each bit of the series of bits is duplicated a predetermined number of times to form a first bit string. The first bit string is larger than the series of bits by a factor of the predetermined number. The computing device performs a binary difference of the first bit string to a second bit string representative of a second BLOB. A result of the binary difference is stored in a navigation patch file.

In one embodiment, an apparatus determines a first series of bits represents an object of a BLOB for existing navigation data include road segments and road attributes and identifies a second series of bits for a new version of the object of the BLOB. The first series of bits is inflated by a predetermined number of times to form a first bit string. The first bit string is larger than the first series of bits by a factor of the predetermined number. The second series of bits is inflated by the predetermined number of times to form a second bit string. The second bit string is larger than the second series of bits by a factor of the predetermined number. The apparatus calculates a binary difference of the second bit string and the first bit string and stores location values for a result of the binary difference in a navigation patch file.

In one embodiment, a computing device receives a navigation patch file and determines a first series of bits for an object of a BLOB for a current version of navigation data that corresponds to the navigation patch file. The first series of bits is duplicated by a predetermined number of times to form a bit string, and the bit string is updated according to the navigation patch file. The computing device reduces the updated bit string according to the predetermined number of times to form a second series of bits and inserts the second series of bits in place of the first series of bits in the object of the BLOB.

BRIEF DESCRIPTION OF THE DRAWINGS

Exemplary embodiments of the present invention are described herein with reference to the following drawings.

FIG. 3 illustrates an example conversion from a bit stream to a bit string.

DETAILED DESCRIPTION

Significant efforts have been directed toward update techniques for navigation databases on embedded devices, including mobile phones or head units in vehicles. As the amount of navigation related content and features on these devices increases, so does the size of the database. As a consequence, the update scripts for keeping the databases up to date with changes in locations, points of interests, and road network have been increasing in size. A lot of data is organized in BLOBs (binary large objects) such as routing or basic map display data. The content of these BLOBs may include "metadata" and "payload" data which is often organized in lists. A navigation file (e.g., SQLite file) may include dozens to thousands of BLOBs in tables.

Figure 1:
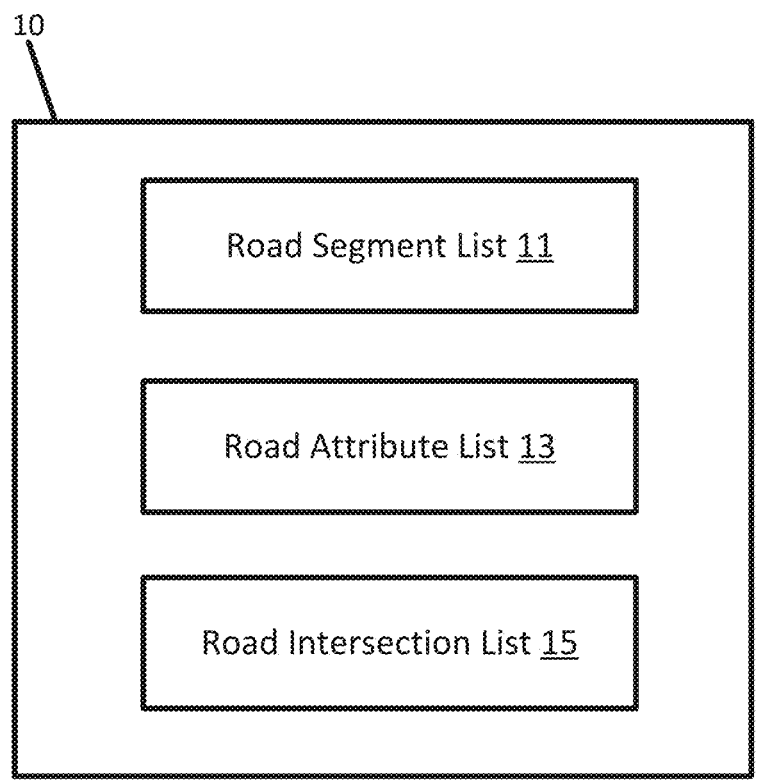

FIG. 1 illustrates a BLOB structure 10 for the main routing function of a navigation database, which may be referred to as the routing tile. The routing tile includes metadata and payload. As illustrated, the metadata includes the routing tile header and the payload includes various list structures such as road segment list 11, road attribute list 13, and road intersection list 15.

The lists may be various sizes. The basic map display may also include many area, line, and point lists. The road attributes 13 may include properties such as functional classification, speed limit, slope, number of lanes, or other attributes. The lists may include road segment identifiers and an array of attributes for road segment. Additional, different, or fewer lists may be included in the BLOB structure 10. In the navigation database, some of the data may be byte aligned or have a standard number of bits. That is, the number of bits is divisible by a power of 2 that is 8 or greater such that an integer number of bytes are used (8 bits make up 1 byte). Other data may be not byte aligned (byte misaligned) and have a nonstandard number of bits indivisible (not divisible) by 8. One example is an attribute for the type of link that includes only 6 bits, resulting in link objects that occupy n bytes and m bits, with m being between 0 and 7. For example, when four 6-bit objects are used, the 24 total bits span 3 bytes. The type of link attribute may provide a coarse direction for the direction of a road segment. The direction may be described a 6 bit number from 0 to 64 that are counted clockwise with sector 9 indicative of a North direction.

Another example of binary encoding may be a basic map display. The core of the basic may display may include 6 bits followed by a list of polygon points. Each of the polygon points describes a location where for each point encoded with a certain number of bits, which may be unequal to 8 or 16 bits. The anchor point may be listed followed by a value describing the number of bits excluding the sign bit. Next, an edge indicator determines whether the edge for the vertex is a pseudo edge that may have resulted from clipping or triangulation. Finally, the remaining vertices are listed.

Replacing the entire navigation database during an update requires significant bandwidth and time. Instead, an update script may be used so that only the changes are sent from the map developer to the embedded device. One technique for identifying the changes is a binary difference. The binary different calculates the difference between two bit strings. The binary difference compares the first bit in one string to the first bit of the other string and so forth.

This may be illustrated using two example bit strings and the hexadecimal representation. Consider bit string A below having 8-bit bytes indicated by alternating underline and not under line and 6-bit objects indicated by alternating bold and not bold.
10110011000011100011100000011001001001000111001
01000111111000110000010000100001000010000100111

Bit string A may be represented in hexadecimal by B30E3819243947E304210427

A new 6-bit object "110011" is inserted at position 2 of the list (becoming the second 6-bit object in the bit string), to form bit string B below:
10110011001111000011100011100000011001001001000011100101000111111000110000010000100001000010000010000100111

The hexadecimal representation of the bit string B would be would be
B33C38E06490E51F8C1084109C.

The two hexadecimal representations differ greatly. Rather than a change to 1 byte and shifting values by one byte, all bytes have been altered. Reproduced for comparison are the hexadecimal representations of strings A and B.

String A: B30E3819243947E304210427 (before inserting)

String B: B33C38E06490E51F8C1084109C (after inserting)

The hexadecimal representations are quite different. Because the objects are 6 bits in length, and bytes are 8 bits in length, objects overlap bytes. Thus, most or every value after the insertion has changed. Performing a binary difference on strings A and B results in a large difference. Describing an update to a navigation database using binary difference in the example would be high cost. For a navigational database including BLOBs, a straightforward binary difference of the old and new BLOB may lead to a rather large update package, even in the instance that only one element is inserted or deleted.

The following embodiments describe examples for an incremental update for a navigational database includes BLOBs with a bit to byte conversion before a binary difference operation is performed between an old version of the database and a new version of the database. The bit to byte conversion modifies each individual bit to a series of bits having the same value. Each series of bits may have a 1-byte size. In other words, the bit 0 is converted to 00000000, and the bit 1 is converted to 11111111. The inflated data may be eight times larger than the original data. After compression is applied, the result of the binary difference may be significantly less than eight times larger but still greater than the actual difference between versions of the database. The result of the binary difference of the inflated data is significantly smaller than the entire database or the binary difference in the example above.

Figure 2:
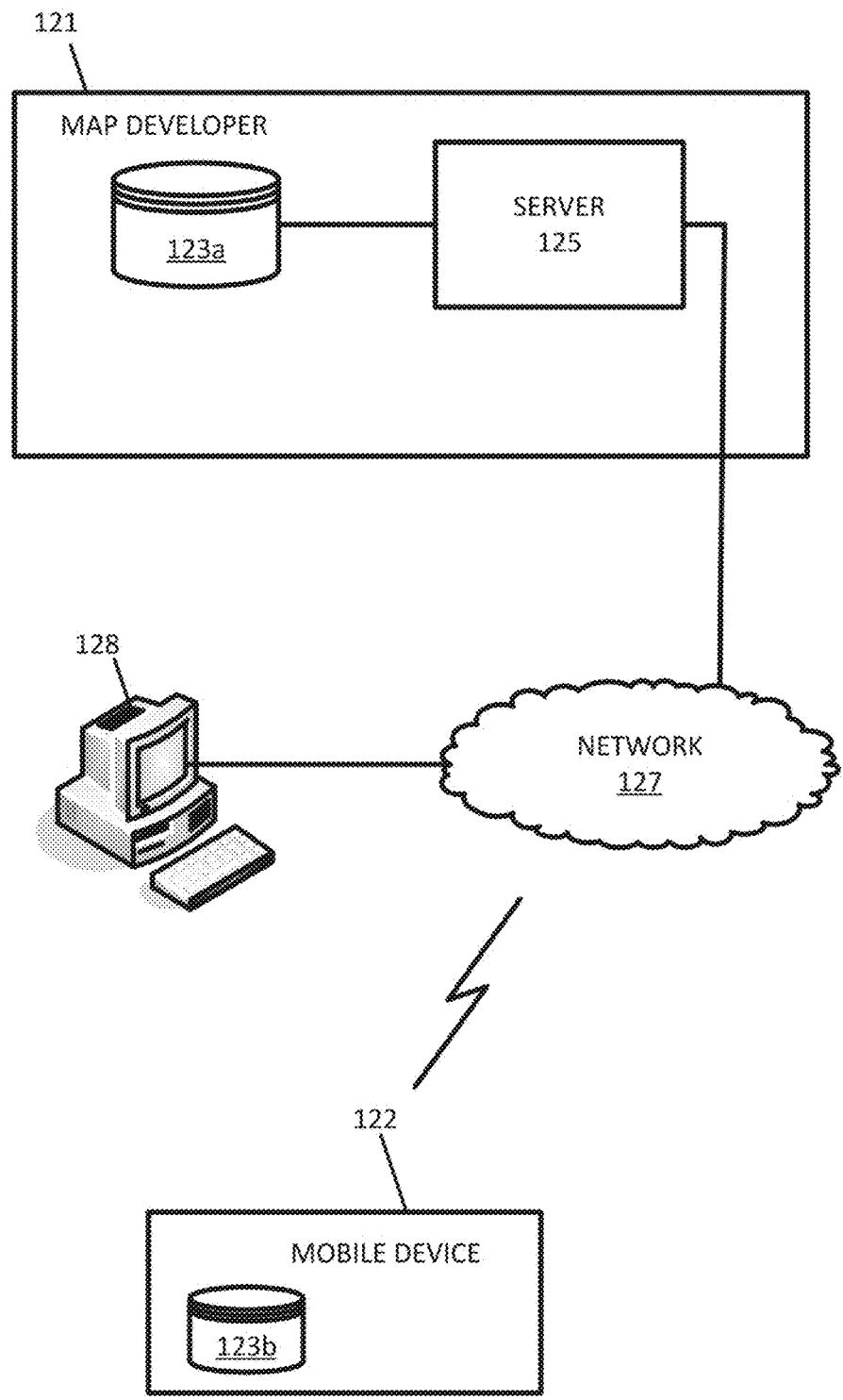
FIG. 2 illustrates an example map developer system.

FIG. 2 illustrates an example map developer system 120 for updating navigation databases. The system 120 includes a developer system 121, one or more mobile devices 122 (navigation devices), a workstation 128, and a network 127. Additional, different, or fewer components may be provided.

For example, many mobile devices 122 and/or workstations 128 connect with the network 127. The developer system 121 includes a server 125 and one or more databases. The database 123a-b may be a geographic database including road links or segments. As shown in FIG. 2, a master copy of the database 123a may be stored at the developer system 121, and a local copy of the database 123b may be stored at the mobile device 122. In one example, the local copy of the database 123b is a full copy of the geographic database, and in another example, the local copy of the database 123b may be a cached or partial portion of the geographic database. The cached portion may be defined based on a geographic location of the mobile device 122 or a user selection made at the mobile device 122.

The server 125 may send map updates to the mobile device 122. The server 125 may update a particular tile of the geographic database 123. The server 125 may send updates to the master copy of the database 123a and/or send updates to the local copy of the database 123b. The server 125 may generate an update script for the navigation data. The server 125 may identify a series of bits representative of a first binary large object (BLOB) for navigation data include road segments and road attributes. The series of bits may be a portion of the BLOB or the entire BLOB. The server 125 may identify the series of bits in response to a byte misalignment in the BLOB.

The server 125 may inflate the series of bits in order to convert each single bit in the series of bits to a byte sized string of bits. In other words, the server 125 duplicates each bit of the series of bits a predetermined number of times to form a first bit string. The first bit string is larger than the series of bits by a factor of the predetermined number. The predetermined number may be 8 so that each bit value becomes byte of all the same bit value. The bit value 1 becomes 11111111, and the bit value 0 becomes 00000000. The duplication of the series of bits may be in response to the identification of the nonstandard number of bits.

The server 125 is configured to perform a binary difference operation. The binary difference operation may be byte subtraction. The binary difference operation may compare data on the byte level. For example, when current navigation data is compared to new navigation data are compared, the first byte of the current navigation data is compared to the first byte of the new navigation data, the second byte of the current navigation data is compared to the second byte of the new navigation data, and so on. The result of the binary difference operation may include the byte locations of the differences in the data and the edit operation for that location. Example edit operations include add data, delete data, or modify data. However, because the data include bytes that have all of the same bits (i.e., the only possibilities may be 00000000 and 11111111), there is only one choice for a chance in the data. In other words, since only one type of change is possible, the result of the binary difference operation may be simplified to only include the byte locations of the changes.

The server 125 may also convert the second BLOB for comparison with the first blob. Thus, the server may identify a second series of bits representative of the second BLOB for navigation data include road segments and road attributes and duplicate each bit of the second series of bits the predetermined number of times to form the second bit string, wherein the second bit string is larger than the second series of bits by a factor of the predetermined number.

The server 125 may store the results of the binary difference in a navigation patch file. The navigation patch file may be stored in the geographic database 123a. One example navigation patch file includes byte locations only. For example, [4, 50, 123] indicates that three bits are changed at the $4^{th}$, $50^{th}$, and $123^{rd}$ byte locations. The example navigation patch file may be mixed with complex data that is added at other portions of the BLOB.

The database 123 may store or maintain geographic data such as, for example, road segment or link data records and node data records. The link data records are links or segments representing the roads, streets, or paths. The node data records are end points (e.g., intersections) corresponding to the respective links or segments of the road segment data records. The road link data records and the node data records may represent, for example, road networks used by vehicles, cars, and/or other entities.

The mobile device 122 may be a personal navigation device ("PND"), a portable navigation device smart phone, a mobile phone, a personal digital assistant ("PDA"), a tablet computer, a notebook computer, and/or any other known or later developed mobile device or personal computer. Non-limiting embodiments of navigation devices may also include relational database service devices, mobile phone devices, or car navigation devices.

The developer system 121, the workstation 128, and the mobile device 122 are coupled with the network 127. The phrase "coupled with" is defined to mean directly connected to or indirectly connected through one or more intermediate components. Such intermediate components may include hardware and/or software-based components.

The computing resources may be divided between the server 125 and the mobile device 122. In some embodiments, the server 125 performs a majority of the processing for calculating the vehicle confidence value and the comparison with the confidence threshold. In other embodiments, the mobile device 122 or the workstation 128 performs a majority of the processing. In addition, the processing is divided substantially evenly between the server 125 and the mobile device 122 or workstation 128.

Figure 3:
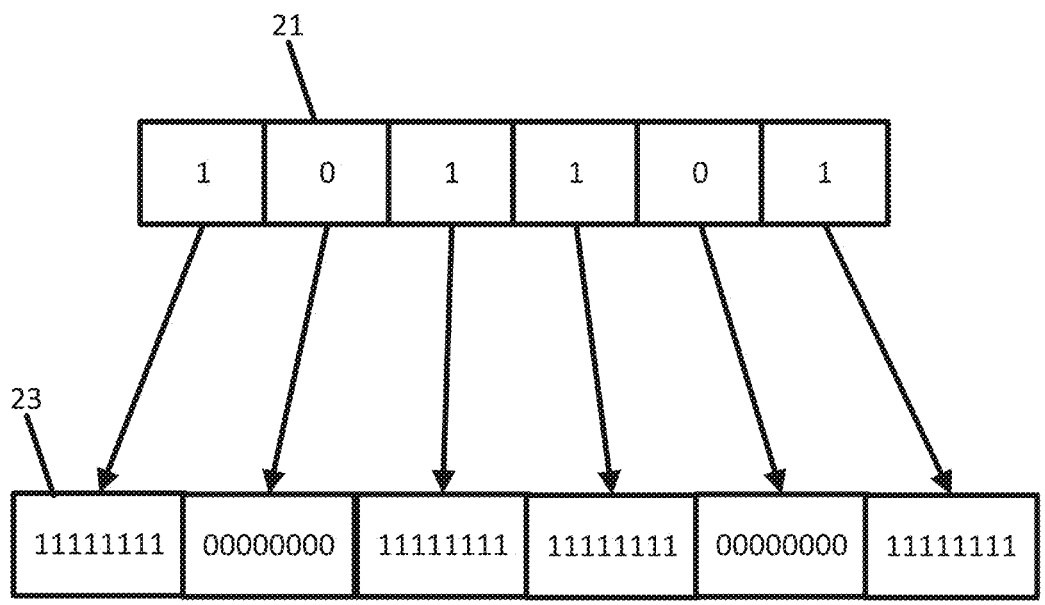
FIG. 3 illustrates an example map tile described as a tree data structure.

FIG. 3 illustrates an example conversion from a bit stream 21 to a bit string 23. In one example, the bit stream may be any number of bits. In another example, the bit stream has a nonstandard number of bits (e.g., 1, 2, 3, 4, 5, 6, 7, 9, 10, 11, 12, 13, 14, 15, or 8*n+x, wherein n is an integer and x is any of the preceding values). The bit stream may represent data in a navigation tile such as road attributes. The bit stream may be converted to the bit string 23. Each bit is convert to a repeating sequences of the same bit.

Figure 4:
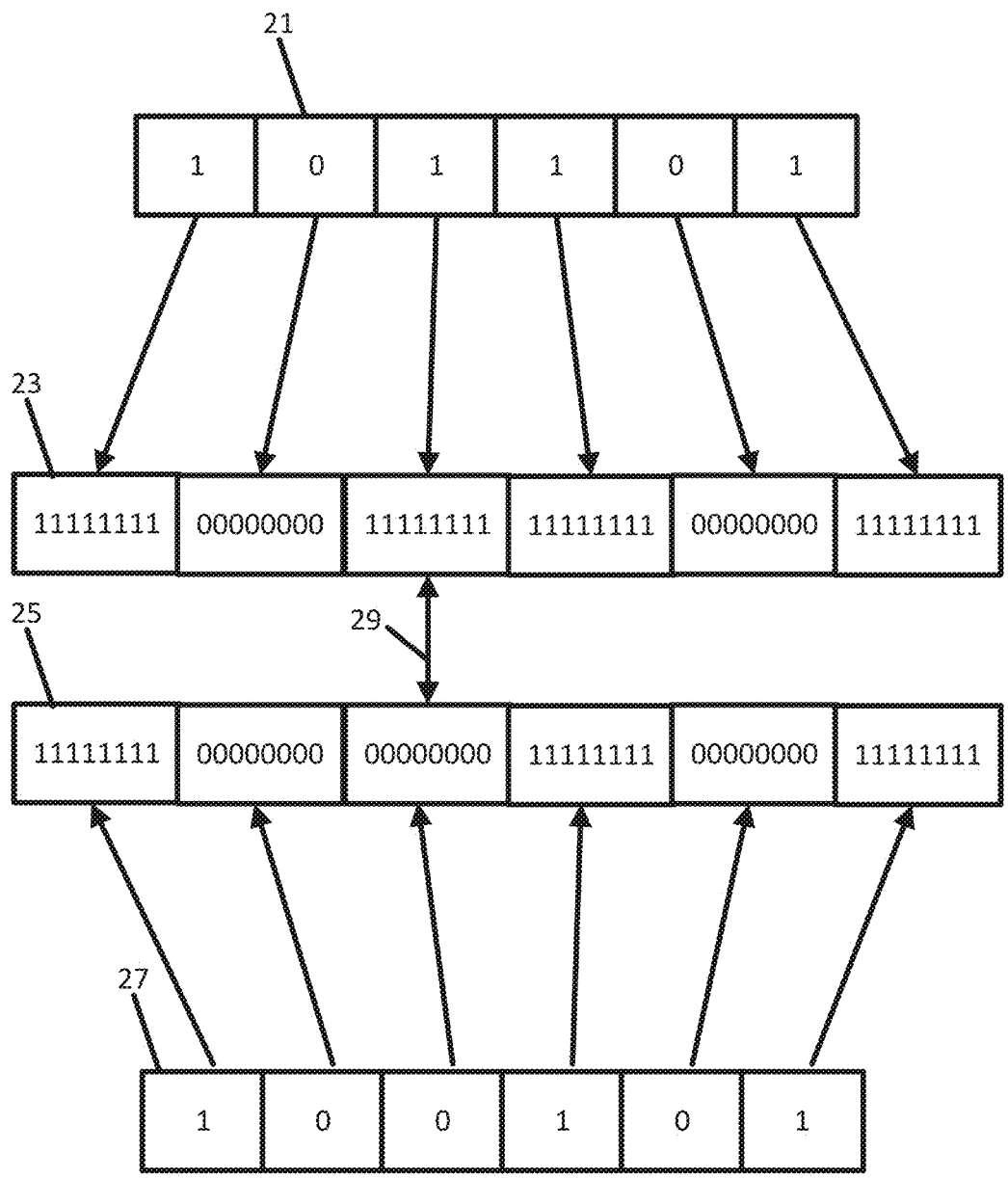
FIG. 4 illustrates an example binary difference for bit strings.

FIG. 4 illustrates an example binary difference for bit strings. The bit stream 21 and bit string 23 may represent a new version of an object of navigation data having a number of bits that is not a multiple of 8. The bit stream 27 and bit string 25 may represent an old or previous version of the same object of navigation data. The binary difference operation may identify differences in the byte length data in the bit string 23 and the bit string 25. The arrow 29 illustrates the only difference between the two versions of the navigation data in the example illustrated. The difference is one bit between the bit stream 21 and bit stream 27. The difference is one entire byte between the bit string 23 and the bit string 25.

Figure 5:
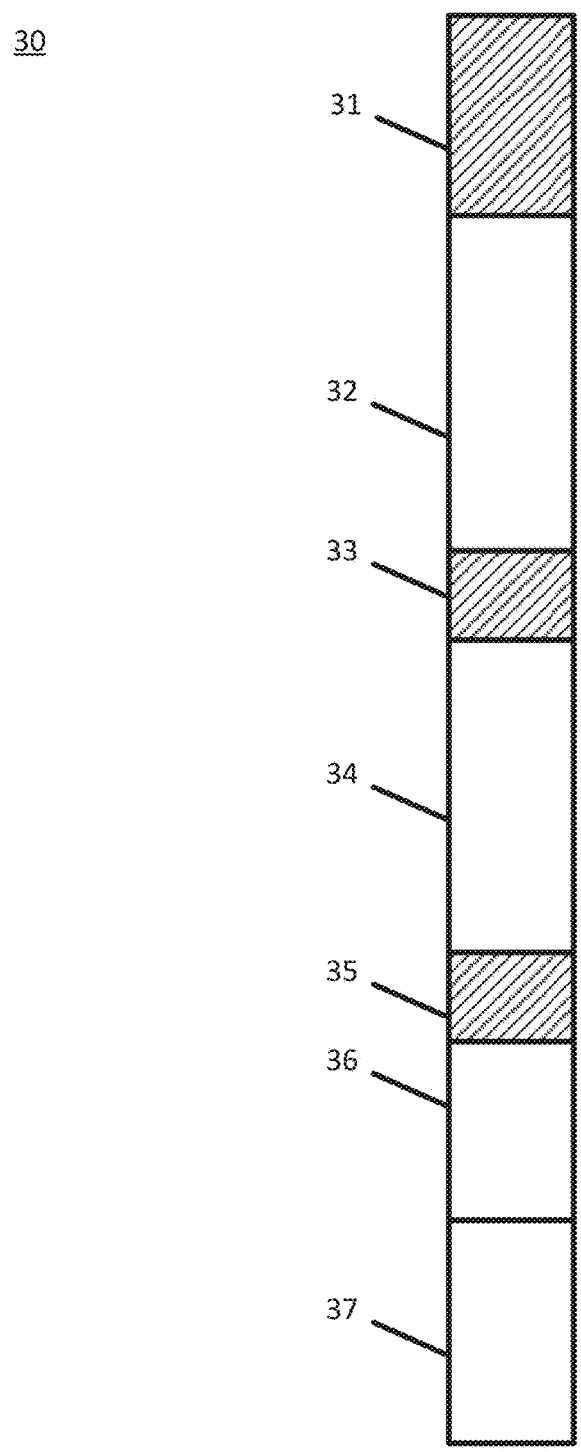
FIG. 5 illustrates an example update script.

FIG. 5 illustrates an example update script 30. The data for the map update 30 includes portions 31 through 39. Rather than storing the complete inflated version of the binary information in the overall update script, simple binary difference data may be used when the binary objects are byte aligned. Simple binary difference data may be based on the hexadecimal representations for those portions. Portions that are hatched (e.g., portions 31, 33, and 35) represent simple binary difference data.

The other portions (e.g., portions 32, 34, 36, and 37) include the update for portions that are not byte aligned. For the portions that are not byte aligned, the bit string is expanded to one byte per bit before the binary difference operation is performed. In other words, the complex binary difference data for portions 32, 34, 36, and 37 may be computed based on first inflating the bit stream to repeating series of bits for each value and subsequently performing the binary difference operation on the repeating series of bits.

As described above, all of the data of a BLOB or file may be inflated before performing a binary difference operation to create an update patch. When portions of the data are already byte aligned, those portions will have some identical strings in the inflated data. The identical portions will have an empty or zero binary difference. Therefore, these algorithms automatically reverse the inefficiencies of inflating the bits for portions that do not need to be inflated.

Figure 6:
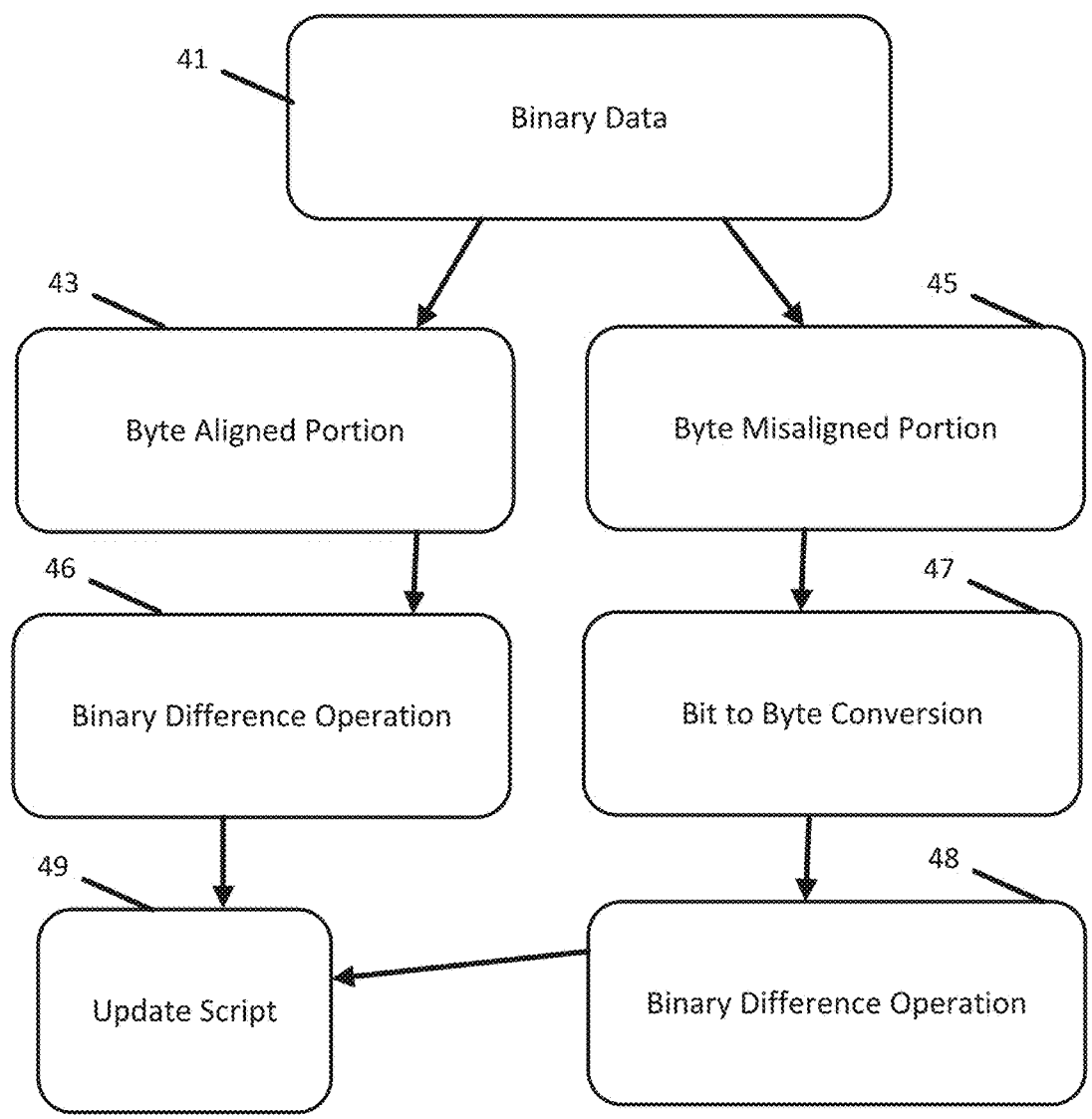
FIG. 6 illustrates an example block diagram for generating a patch program.

In an alternative embodiment or example, the server 125 may distinguish different portions of the BLOB or file. FIG. 6 illustrates an example block diagram for generating a patch program. The block diagram begins with binary data 41. The server 41 is configured to classify the binary data 41. In one example, the binary data 41 is divided into objects made up bits. Each object may describe an aspect of a navigational data. Some objects such as the name of a road segment, which is made of alphanumeric characters, may include a whole number of bytes. Some objects, such as an attribute list, may be described using less than a whole number of bytes.

The server 41 may apply a modulus function to objects to determine whether the objects should be classified as a byte aligned portion 43 or a byte misaligned portion 45. For example X mod 8, where X is the number of bits in the object returns a value equal to the reminder after X is divided by 8. When the value is 0, the object is byte aligned and classified in the byte aligned portion 43. When the value is any value except 0, the object is byte misaligned and classified in the byte misaligned portion 45.

The objects classified in the byte aligned portion 43 proceed directly to the binary difference operation 46. The binary difference operation 46 may first convert the object to a hexadecimal representation. Then each hexadecimal value (e.g., pair of alphanumeric values) for the objects are compared to a prior version of the object. The difference is stored in the update script 49 or navigation data patch program.

The objects classified in the byte misaligned portion 45 proceed to a bit to byte conversion 47. The bit to byte conversion 47 converts each single bit to a series of bits having a byte length. The data size of the objects in the byte misaligned portion 45 may be inflated by a factor of 8. After the bit to byte conversion 47, the series of bits proceed to binary difference operation 48. Conceptually, the binary difference operation 46 and the binary difference operation 48 may be merged. The result of the binary difference operation 48 may include instance labels, or byte locations, wherein the bit streams describe the byte misaligned objects are compared to a prior version of the object. The difference is stored in the update script 49 or navigation data patch program, for example, according to the technique described above with respect to FIG. 5.

The navigation data patch program or update file may be applied to another version of the BLOB (third BLOB) of a navigation database. The to-be-updated navigation database may be a database maintained by the server 125. The to-be-updated navigation database may be stored locally at a mobile device 122. The to-be-updated navigation database may be store at a third party customer. In some examples, the third party of mobile device 122 requests updates. In some examples, the updates are broadcasted or sent out according to a time schedule.

The application of the navigation data patch program or update file may also involve inflating the bits of the to-be-updated objects. For example, each bit of the third BLOB may be duplicated from the format of the navigation database by repeating the bits for the predetermined number of times to form a third bit string. The third bit string may be modified based on the navigation patch file. Finally, the inflated stream of bits is deflated to convert each byte of repeating bits back to a single bit of the third bit string to return to the format of the navigation database. In another example, the navigation data patch program or update file includes bit locations of the two be changed bits, which may be applied directly to the stream of bits without inflating and subsequently deflating the stream of bits for the third BLOB.

Consider one example first version of a bit stream or BLOB:
10110011000011100011100000011001001001000011100101000111111000110000010000100001000001000010000100111, and a second version of the same bit stream or BLOB having a new portion underlined:
101100110011110001110001110000001100100100100001110010100011111100001100000100001000010000010000100111.

Before the comparison, both bit streams are inflated. The first bit stream is inflated to "11111111 00000000 11111111 11111111 00000000 00000000 11111111 11111111 00000000 00000000 00000000 00000000 11111111 11111111 11111111 . . . " The second bit stream is inflated to "11111111 00000000 11111111 11111111 00000000 00000000 11111111 11111111 00000000 00000000 11111111 11111111 11111111 . . . " When the first bit stream and the second bit stream are identical, as in the first 10 bits, the inflated portions of the first bit stream and the second bit stream are identical. The binary difference at these identical portions is 0 or nul. On the other portions of the bit stream, the binary difference describes the differences of the inflated portions.

In one example, the update script includes three instructions to create a new file: (1) keep bytes 1 to 10 of the old file in the same position in the new file, (2) insert the extra bytes "111100" and add them to the new file, and (3) appends bytes 11 to 86 from the old file after the inserted bytes.

Figure 7:
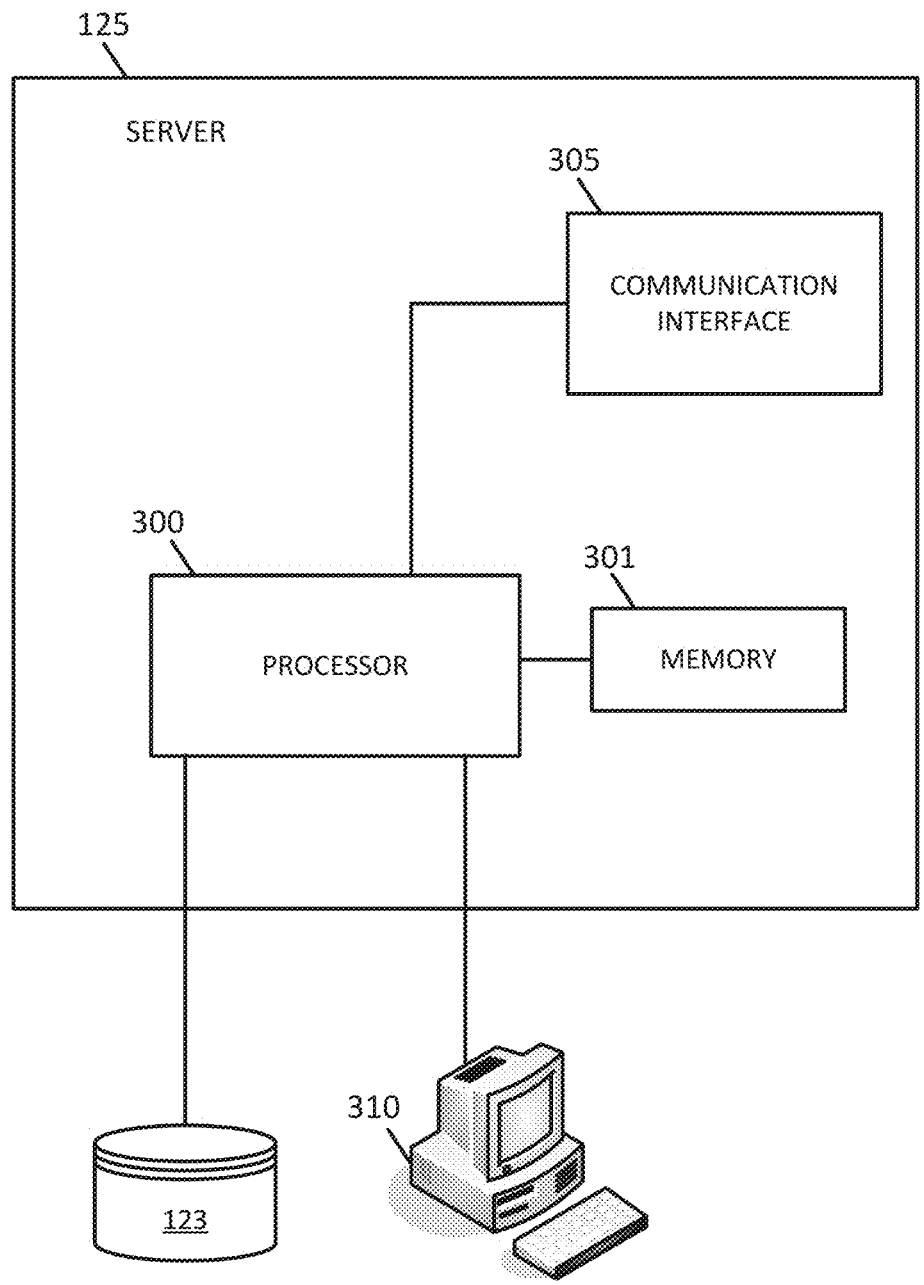
FIG. 7 illustrates an example server of the map developer system.
Figure 8:
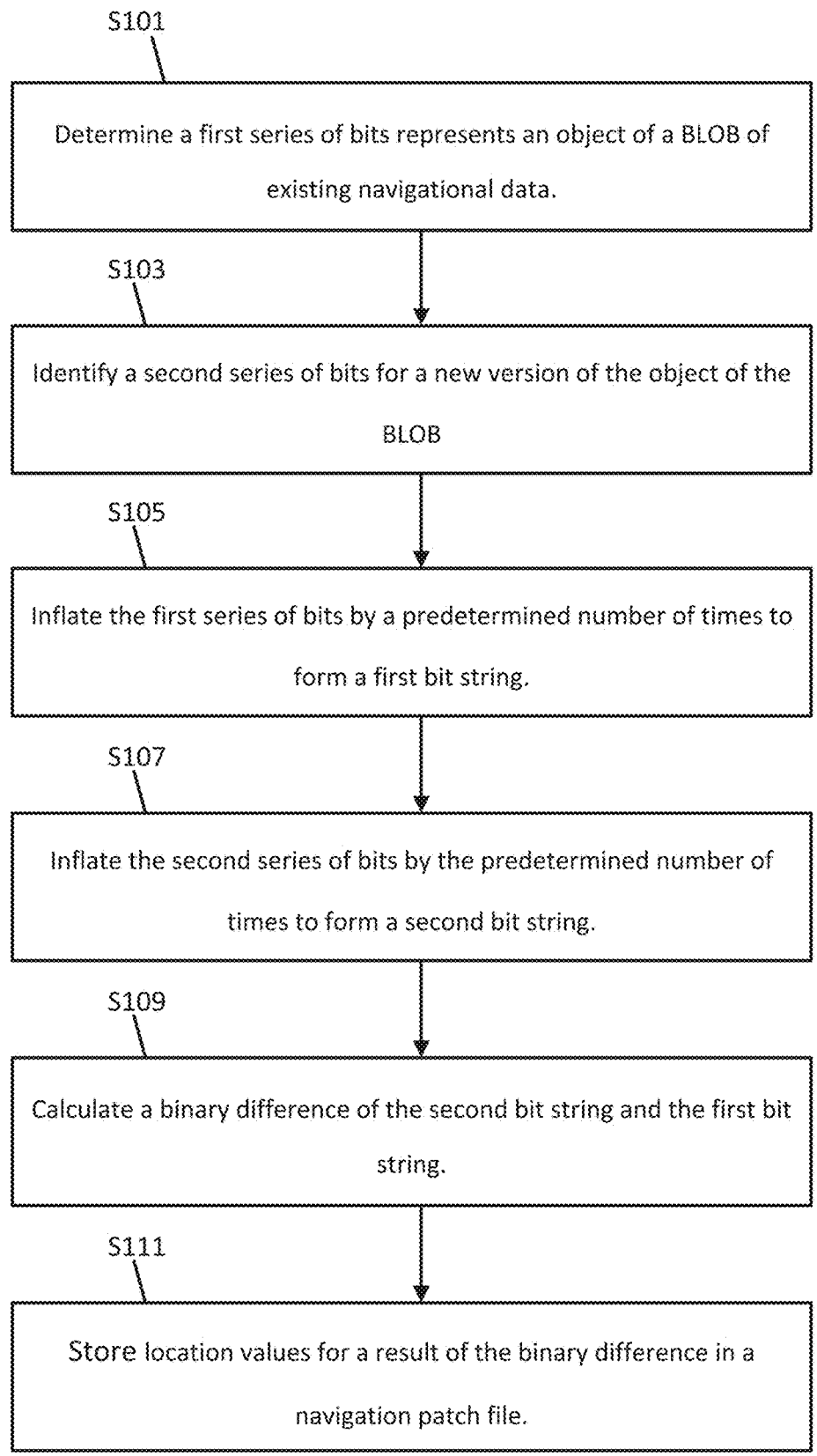
FIG. 8 illustrates an example flowchart for the server of FIG. 7.

FIG. 7 illustrates an example server 125. The server 125 includes a processor 300, a communication interface 305, and a memory 301. The server 125 may be coupled to a database 123 and a workstation 310. The workstation 310 may be used to enter data regarding the type of update script that will be used (e.g., binary difference versus bit to byte conversion). The database 123 may be a geographic database as discussed above. Additional, different, or fewer components may be provided in the server 125. FIG. 8 illustrates an example flowchart for the operation of server 125. Additional, different, or fewer acts may be provided. In act S101, the processor 300 determines a first series of bits represents an object of a BLOB for existing navigation data include road segments and road attributes. For example, the processor 300 may calculate a modulus function based on the predetermined number for the BLOB. When a result of the modulus function is nonzero, the object is labeled as a byte misaligned object.

At act S103, the processor 300 identifies a second series of bits for a new version of the object of the BLOB. In one example, the processor 300 identifies an object identifier from the existing version of the database in S101 and accesses the corresponding object in the new version of the database based on the object identifier. In another example, the object in the new version of the database may be identified based on comparing the data in the objects.

At act S105, the processor 300 duplicates or inflates the first series of bits by a set number of times to form a first bit string. Similarly, at act S107, the processor 300 duplicates or inflates the second series of bits by the set number of times to form a second bit string. The resulting first and second bit stream are larger than the respective first and second series of bits by a factor of the set number.

At act S109, the processor 300 calculates a binary difference of the second bit string and the first bit string. One algorithm for implementing the binary difference may be bsdiff or bsdiff[z], where z is the base number. The result of the binary difference may include location values that indicate byte sequence numbers in which a difference was calculated between the second bit string and the first bit string.

At act S111, the memory 204 stores location values for a result of the binary difference in a navigation patch file. The navigation patch file may be sent to the mobile device 122, or any navigation device, upon a received request or according to a time schedule.

The geographic database may include road segments or links. Each road segment is associated with two nodes (e.g., one node represents the point at one end of the road segment and the other node represents the point at the other end of the road segment). The node at either end of a road segment may correspond to a location at which the road meets another road, i.e., an intersection, or where the road dead-ends. The road segments may include sidewalks and crosswalks for travel by pedestrians.

Each of the road segments or links may be associated with various attributes or features stored in lists that are not byte aligned. The road segment data record may include data that indicate a speed limit or speed category (i.e., the maximum permitted vehicular speed of travel) on the represented road segment. The road segment data record may also include data that indicate a classification such as a rank of a road segment that may correspond to its functional class. The road segment data includes a segment ID by which the data record can be identified in the geographic database 123. The road segment data, nodes, segment IDs, attributes, fields, and other data may be organized in data structures described above.

The road segment data may include data identifying what turn restrictions exist at each of the nodes which correspond to intersections at the ends of the road portion represented by the road segment, the name or names by which the represented road segment is known, the length of the road segment, the grade of the road segment, the street address ranges along the represented road segment, the permitted direction of vehicular travel on the represented road segment, whether the represented road segment is part of a controlled access road (such as an expressway), a ramp to a controlled access road, a bridge, a tunnel, a toll road, a ferry, and so on. The additional road segment data may be organized in data tree structures. Alternatively, the data tree structures may be included in a separate database, for example, internal to the server 125 and/or the mobile device 122, or at an external location.

The mobile device 122 is configured to execute routing algorithms to determine an optimum route to travel along a road network from an origin location to a destination location in a geographic region. Using input from the end user, the navigation device 122 examines potential routes between the origin location and the destination location to determine the optimum route. The navigation device 122 may then provide the end user with information about the optimum route in the form of guidance that identifies the maneuvers required to be taken by the end user to travel from the origin to the destination location. Some mobile device 122 show detailed maps on displays outlining the route, the types of maneuvers to be taken at various locations along the route, locations of certain types of features, and so on.

The mobile device 122 is also configured to execute the update script or other type of navigation patch on local map data. The navigation device 122 receives the update script from the server 125 by way of network 127. The update script includes less data than a wholesale replacement of a portion of the database or BLOB and requires less bandwidth and/or transmission time than the portion of the database or BLOB. The update script may be stored in a computer readable medium coupled to the server 125 or the navigation device 122.

Figure 9:
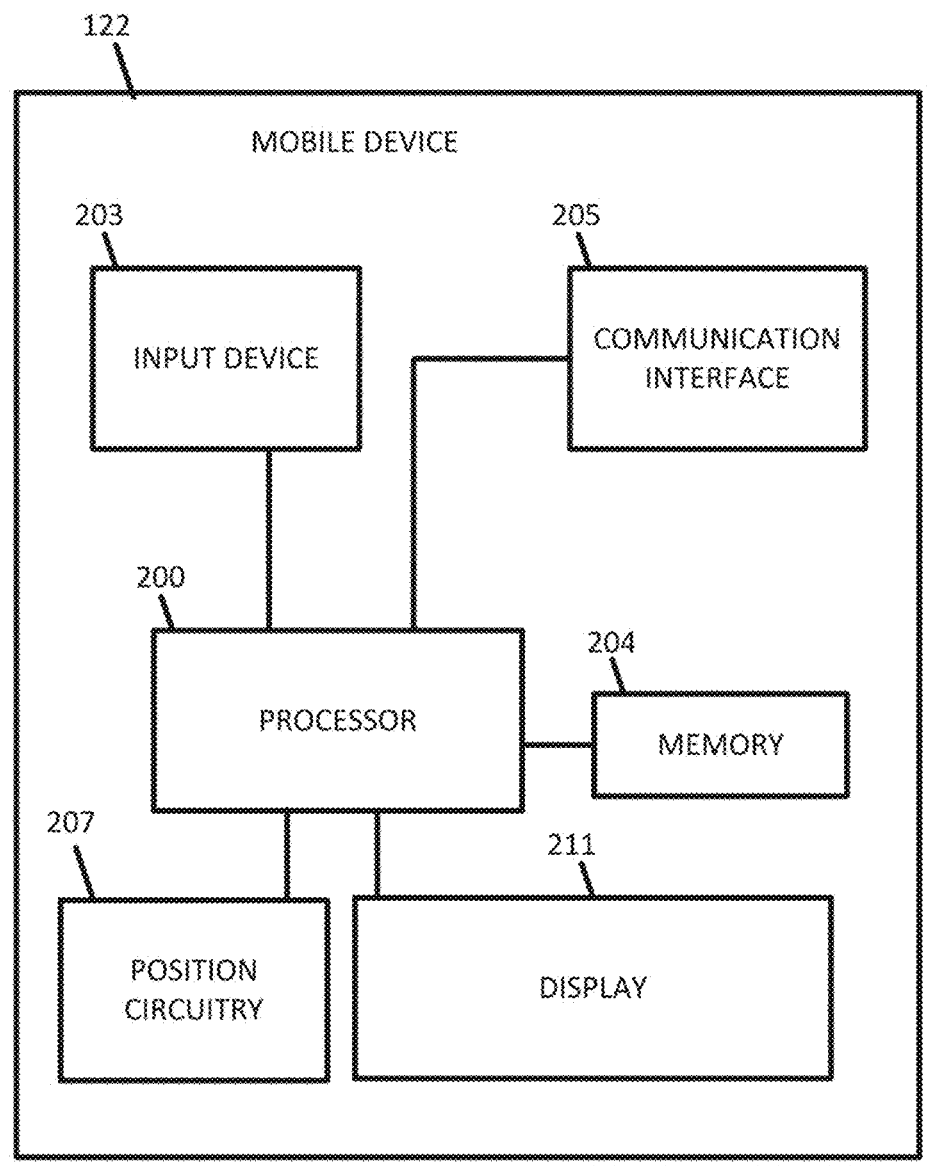
FIG. 9 illustrates an example mobile device in communication with the map developer system.
Figure 10:
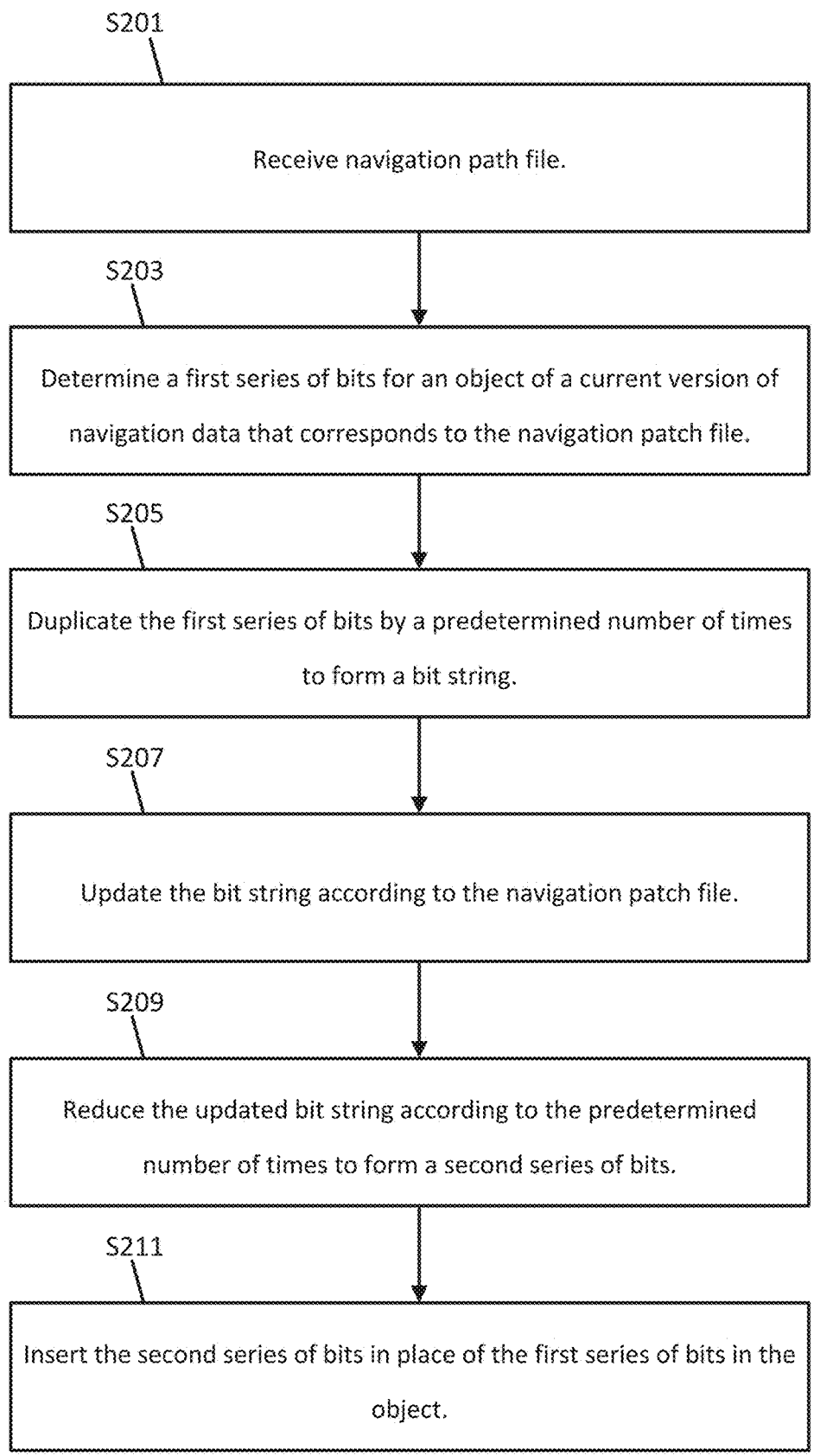
FIG. 10 illustrates an example flowchart for the mobile device of FIG. 9.

FIG. 9 illustrates an exemplary mobile device 122 of the system of FIG. 1 and FIG. 10 illustrates an example flowchart for the mobile device of FIG. 9. The mobile device 122 includes a processor 200, a memory 204, an input device 203, a communication interface 205, position circuitry 207, and a display 211. Additional, different, or fewer components are possible for the mobile device/personal computer 122.

At act S201, the communication interface 205 or processor 200 may receive an update script or navigational patch file from the server 125. The patch file may be received based on a request sent by the communication interface 205 through the network 127 based on instructions from the user input 203. The patch file may be received based on a schedule. For example, updates may be sent weekly, monthly, or quarterly. In one example, the schedule is defined by the mobile device 122. In another example, the schedule is defined according to a subscription or an online purchase.

At act S203, the processor 200 determines a first series of bits for an object of a BLOB for a current version of navigation data that corresponds to the navigation patch file. In one example, the navigation patch file lists an object identifier (e.g., name or number) that is referenced in the current version of the navigation data. In another example, the processor 200 unpacks the navigation patch file to identify the payload data. The payload data is matched to the objects of the current version of the navigation data.

At act S205, the processor 200 duplicates the first series of bits by a predetermined number of times to form a bit string. For example, the processor 200 identifies a first bit in the bit stream and duplicates the bit to a byte length string of data. The processor 200 may repeat this technique for each bit in the first series of bits. In one example, vector multiplication is used to convert the bit to a byte length string. The vector multiplication may be a multiplier vector [1 1 1 1 1 1 1 1] multiplied by the bit. Thus,[1 1 1 1 1 1 1 1]*1 is [1 1 1 1 1 1 1 1], and [1 1 1 1 1 1 1 1]*0 is [0 0 0 0 0 0 0 0].

At act S207, the processor 200 updates the bit string according to the navigation patch file. In one example, the navigation patch file includes bytes that are inserted into a particular location in the bit string. In one example, the navigation patch file includes bytes that are appended to the end of the bit string. In one alternative, the navigation path file includes locations whether the values in the bit string should be flipped.

At act S209, the processor 200 reduces the updated bit string according to the predetermined number of times to form a second series of bits. In other words, the byte length series of bits [1 1 1 1 1 1 1 1] and [0 0 0 0 0 0 0 0] are reduced to 1 and 0, respectively. The reduction may be implemented using a dot product of [1 0 0 0 0 0 0 0] and the series of bits. Thus, the dot product of [1 1 1 1 1 1 1 1] and [1 0 0 0 0 0 0 0] is 1, and the dot product of [0 0 0 0 0 0 0 0] and [1 0 0 0 0 0 0 0] iso.

At act S211, the processor 200 inserts the second series of bits in place of the first series of bits in the object of the BLOB. The replacement step of act S211 may repeated for multiple objects described in the navigational patch file. The processor 200 may test the navigational database after the bits are inserted. The test may be an integrity check, a parity check, or a routing algorithm that is applied to the updated navigational data. When the test is successful, the update is made permanent and an acknowledgement is presented by the display 211. When the test is unsuccessful, the update may be reversed an error message may be presented on display 211.

The processor 200 executes the navigational patch file on a set of navigation data stored in memory 204. The set of navigation data may be an entire geographic database. The set of navigation data may be a subset of the geographic database. For example, the subset may be cached according to the geographic position of the mobile device 122. For example, the position circuitry 207 may determine the geographic position (e.g., latitude and longitude) and request the set of navigation data from the server 125 accordingly. In another example, the user may select a geographic region to be loaded in the memory 204 through the user input 203.

The positioning circuitry 207 may include a Global Positioning System (GPS), Global Navigation Satellite System (GLONASS), or a cellular or similar position sensor for providing location data. The positioning system may utilize GPS-type technology, a dead reckoning-type system, cellular location, or combinations of these or other systems. The positioning circuitry 207 may include suitable sensing devices that measure the traveling distance, speed, direction, and so on, of the mobile device 122. The positioning system may also include a receiver and correlation chip to obtain a GPS signal. Alternatively or additionally, the one or more detectors or sensors may include an accelerometer built or embedded into or within the interior of the mobile device 122. The accelerometer is operable to detect, recognize, or measure the rate of change of translational and/or rotational movement of the mobile device 122. The mobile device 122 receives location data from the positioning system. The location data indicates the location of the mobile device 122.

The input device 203 may be one or more buttons, keypad, keyboard, mouse, stylist pen, trackball, rocker switch, touch pad, voice recognition circuit, or other device or component for inputting data to the mobile device 100. The input device 203 and the display 211 may be combined as a touch screen, which may be capacitive or resistive. The display 211 may be a liquid crystal display (LCD) panel, light emitting diode (LED) screen, thin film transistor screen, or another type of display.

The controller 200 and/or processor 300 may include a general processor, digital signal processor, an application specific integrated circuit (ASIC), field programmable gate array (FPGA), analog circuit, digital circuit, combinations thereof, or other now known or later developed processor. The controller 200 and/or processor 300 may be a single device or combinations of devices, such as associated with a network, distributed processing, or cloud computing.

The memory 204 and/or memory 301 may be a volatile memory or a non-volatile memory. The memory 204 and/or memory 301 may include one or more of a read only memory (ROM), random access memory (RAM), a flash memory, an electronic erasable program read only memory (EEPROM), or other type of memory. The memory 204 and/or memory 301 may be removable from the mobile device 122, such as a secure digital (SD) memory card.

The communication interface 205 and/or communication interface 305 may include any operable connection. An operable connection may be one in which signals, physical communications, and/or logical communications may be sent and/or received. An operable connection may include a physical interface, an electrical interface, and/or a data interface. The communication interface 205 and/or communication interface 305 provides for wireless and/or wired communications in any now known or later developed format.

The network 127 may include wired networks, wireless networks, or combinations thereof. The wireless network may be a cellular telephone network, an 802.11, 802.1, 802.20, or WiMax network. Further, the network 127 may be a public network, such as the Internet, a private network, such as an intranet, or combinations thereof, and may utilize a variety of networking protocols now available or later developed including, but not limited to TCP/IP based networking protocols.

The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored. These examples may be collectively referred to as a non-transitory computer readable medium.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. For example, standards for Internet and other packet switched network transmission (e.g., TCP/IP, UDP/IP, HTML, HTTP, HTTPS) represent examples of the state of the art. Such standards are periodically superseded by faster or more efficient equivalents having essentially the same functions. Accordingly, replacement standards and protocols having the same or similar functions as those disclosed herein are considered equivalents thereof.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

As used in this application, the term 'circuitry' or 'circuit' refers to all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

Processors suitable for the execution of a computer program include, by way of example, both general and special purpose microprocessors, and anyone or more processors of any kind of digital computer. Generally, a processor receives instructions and data from a read only memory or a random access memory or both. The essential elements of a computer are a processor for performing instructions and one or more memory devices for storing instructions and data. Generally, a computer also includes, or is operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio player, a Global Positioning System (GPS) receiver, to name just a few. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a device having a display, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings and described herein in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

It is intended that the foregoing detailed description be regarded as illustrative rather than limiting and that it is understood that the following claims including all equivalents are intended to define the scope of the invention. The claims should not be read as limited to the described order or elements unless stated to that effect. Therefore, all embodiments that come within the scope and spirit of the following claims and equivalents thereto are claimed as the invention.

I claim:

1. A method comprising:
   identifying, using a processor, a series of bits representative of a first binary large object (BLOB) for navigation data including road segments and road attributes;
   calculating, using the processor, a modulus function based on a predetermined number for the BLOB, wherein a result of the modulus function is nonzero and indicates the series of bits are misaligned;
   duplicating, using the processor, each bit of the series of bits the predetermined number of times to form a first bit string, wherein the first bit string is larger than the series of bits by a factor of the predetermined number;
   performing a binary difference of the first bit string of the first BLOB to a second bit string representative of a second BLOB for navigation data including road segments and road attributes, wherein the binary difference at least compares a bit of the first bit string to a corresponding bit of the second bit string;
   storing a result of the binary difference of the first bit string and the second bit string in a navigation patch file;
   applying the navigation patch file to a third BLOB of a navigation database;
   duplicating each bit of a series of the third BLOB in a format of the navigation database by the predetermined number of times to form a third bit string;
   modifying the third bit string based on the navigation patch file; and
   removing bits of the third bit string to return the navigation patch file to the format of the navigation database.

2. The method of claim 1, wherein the predetermined number is 8.

3. The method of claim 1, wherein a 1 bit in the series of bits corresponds to 11111111 in the first bit string and a 0 bit in the series of bits corresponds to 00000000 in the first bit string.

4. The method of claim 1, further comprising:
   identifying, using the processor, a second series of bits representative of the second BLOB for navigation data include road segments and road attributes; and
   duplicating, using the processor, each bit of the second series of bits by the predetermined number of times to form the second bit string, wherein the second bit string is larger than the second series of bits by a factor of the predetermined number.

5. The method of claim 1, wherein the binary difference compares a hexadecimal representation of the first bit string to a hexadecimal representation of the second bit string.

6. The method of claim 1, further comprising:
   identifying a nonstandard number of bits in the first BLOB, wherein the duplicating each bit of the series of bits is in response to the nonstandard number of bits.

7. The method of claim 1, wherein the BLOB is part of a complete navigation file.

8. An apparatus comprising:
   at least one processor; and
   at least one memory including computer program code for one or more programs; the at least one memory and the computer program code configured to, with the at least one processor, cause the apparatus to at least perform:
   determine a first series of bits represents an object of a binary large object (BLOB) for existing navigation data include road segments and road attributes;
   calculate a modulus function based on a predetermined number for the BLOB, wherein a result of the modulus function is nonzero and indicates the first series of bits are misaligned;
   identify a second series of bits for a new version of the object of the BLOB;
   inflate the first series of bits by the predetermined number of times to form a first bit string, wherein the first bit string is larger than the first series of bits by a factor of the predetermined number;
   inflate the second series of bits by the predetermined number of times to form a second bit string, wherein the second bit string is larger than the second series of bits by a factor of the predetermined number;
   calculate a binary difference of the second bit string and the first bit string;
   store location values for a result of the binary difference in a navigation patch file;
   apply the navigation patch file to a corresponding BLOB of a navigation database;
   duplicate bits of a series in the corresponding BLOB in a format of the navigation database by the predetermined number of times to form a third bit string;
   modifying the third bit string based on the navigation patch file; and
   removing bits of the third bit string to return the navigation patch file to the format of the navigation database.

9. The apparatus of claim 8, wherein the location values indicate byte sequence numbers in which a difference was calculated between the second bit string and the first bit string.

10. The apparatus of claim 8, wherein the predetermined number is a base number indicative of a standard character value.

11. The apparatus of claim 10, wherein the base number is 8 or 16.

12. The apparatus of claim 8, wherein the at least one memory and the computer program code configured to, with the at least one processor, cause the apparatus to at least perform:
   send the navigation patch file based on a time schedule or a request corresponding to a navigation device.

13. The apparatus of claim 8, wherein the object includes a nonstandard number of bits that is not divisible by 8.

14. A non-transitory computer readable medium including instructions that when executed are operable to:
   identify, using a processor, a series of bits representative of an object of a first binary large object (BLOB) for navigation data including road segments and road attributes;
   calculate, using the processor, a modulus function based on a predetermined number for the BLOB, wherein a result of the modulus function is nonzero and indicates the series of bits are misaligned;
   duplicate, using the processor, each bit of the series of bits the predetermined number of times to form a first bit string, wherein the first bit string is larger than the series of bits by a factor of the predetermined number;
   perform a binary difference of the first bit string of the first BLOB to a second bit string representative of a second BLOB for navigation data including road segments and road attributes, wherein the binary difference at least compares a bit of the first bit string to a corresponding bit of the second bit string;
   store a result of the binary difference of the first bit string and the second bit string in a navigation patch file;
   apply the navigation patch file to a third BLOB of a navigation database;
   duplicate each bit of a series of the third BLOB in a format of the navigation database by the predetermined number of times to form a third bit string;
   modify the third bit string based on the navigation patch file; and
   remove bits of the third bit string to return the navigation patch file to the format of the navigation database.

15. The non-transitory computer readable medium of claim 14, wherein the object includes a number of bits that is not divisible by 8.

16. The non-transitory computer readable medium of claim 14, wherein the navigation data includes road segment attributes.

\* \* \* \* \*